(12) United States Patent
Shin et al.

(10) Patent No.: US 8,848,370 B2
(45) Date of Patent: Sep. 30, 2014

(54) INVERTER FOR VEHICLE

(75) Inventors: Dongmin Shin, Gyeonggi-do (KR);
Wooyong Jeon, Seoul (KR); In Pil Yoo,
Seoul (KR); Hyong Joon Park,
Gyeonggi-do (KR); Joon Hwan Kim,
Seoul (KR); Sungjun Yoon,
Gyeonggi-do (KR); Minji Kim,
Gyeonggi-do (KR); Jaehoon Yoon,
Chungcheongnam-do (KR); **Jung Hong
Joo**, Gyeonggi-do (KR)

(73) Assignee: Hyundai Motor Company, Seoul (KR)

( * ) Notice: Subject to any disclaimer, the term of this
patent is extended or adjusted under 35
U.S.C. 154(b) by 255 days.

(21) Appl. No.: 13/315,104

(22) Filed: Dec. 8, 2011

(65) Prior Publication Data
US 2013/0039009 A1 Feb. 14, 2013

(30) Foreign Application Priority Data
Aug. 10, 2011 (KR) ........................ 10-2011-0079529

(51) Int. Cl.
*H05K 7/20* (2006.01)
*H02M 7/00* (2006.01)
*B60K 6/22* (2007.10)
*H02M 7/42* (2006.01)
*H05K 7/14* (2006.01)
*H02M 1/00* (2006.01)

(52) U.S. Cl.
CPC ........... *H05K 7/20927* (2013.01); *H02M 7/003*
(2013.01); *B60K 6/22* (2013.01); *H02M 7/42*
(2013.01); *H05K 7/1432* (2013.01); *Y02T
10/7241* (2013.01); *B60L 2210/40* (2013.01);
*H05K 7/20* (2013.01); *H02M 1/00* (2013.01)

USPC ...... 361/699; 361/679.53; 361/698; 361/707;
361/715; 165/80.2; 165/80.4; 165/80.5; 165/
104.33; 363/132; 363/141; 363/177; 363/178

(58) Field of Classification Search
USPC .......... 361/679.46, 679.54, 679.53, 688, 689,
361/698, 699, 702–712, 131, 132, 141–144,
361/178; 165/80.2, 80.3, 80.4, 80.5,
165/104.33, 104.34, 185; 174/16.3, 35, 50,
174/50.52, 58, 35 R, 35 GS; 62/259.2;
307/9.1, 10.1, 45, 58, 82, 147;
363/131, 132, 141–144, 178
See application file for complete search history.

(56) References Cited

U.S. PATENT DOCUMENTS

| | | | | |
|---|---|---|---|---|
| 5,631,821 | A | * | 5/1997 | Muso ........................... 363/141 |
| 6,166,937 | A | * | 12/2000 | Yamamura et al. ........... 363/141 |
| 6,327,165 | B1 | * | 12/2001 | Yamane et al. ............... 363/132 |
| 6,621,701 | B2 | * | 9/2003 | Tamba et al. ................. 361/699 |

(Continued)

FOREIGN PATENT DOCUMENTS

| | | | | |
|---|---|---|---|---|
| JP | 11-346480 | A | | 12/1999 |
| JP | 3237609 | | | 12/2001 |
| JP | 2004266973 | A | * | 9/2004 ............ H01L 23/473 |

(Continued)

*Primary Examiner* — Michail V Datskovskiy
(74) *Attorney, Agent, or Firm* — Edwards Wildman Palmer
LLP; Peter F. Corless (57) ABSTRACT

An inverter for a vehicle is disclosed. The inverter for the
vehicle illustratively includes: a power module provided with
a power semiconductor device; a cooling module coupled to
the power module and flowing a coolant therethrough; and a
capacitor module mounted at the cooling module through a
mounting unit and adapted to absorb a ripple current of the
power module.

7 Claims, 7 Drawing Sheets

(56) References Cited

U.S. PATENT DOCUMENTS

| | | | |
|---|---|---|---|
| 6,762,937 B2 * | 7/2004 | Kimoto et al. | 361/699 |
| 7,542,318 B2 * | 6/2009 | Otsuka et al. | 363/178 |
| 7,561,429 B2 * | 7/2009 | Yahata et al. | 361/715 |
| 7,710,721 B2 * | 5/2010 | Matsuo et al. | 361/699 |
| 7,742,303 B2 * | 6/2010 | Azuma et al. | 361/699 |
| 7,812,443 B2 * | 10/2010 | Tokuyama et al. | 257/706 |
| 8,064,234 B2 * | 11/2011 | Tokuyama et al. | 363/141 |
| 8,072,760 B2 * | 12/2011 | Matsuo et al. | 361/707 |

FOREIGN PATENT DOCUMENTS

| | | |
|---|---|---|
| JP | 2004-312866 A | 11/2004 |
| JP | 2007036214 A | 2/2007 |
| JP | 2010182898 | 8/2010 |
| KR | 10-0765660 | 10/2007 |
| KR | 10-2009-0014789 A | 2/2009 |

* cited by examiner

INVERTER FOR VEHICLE

CROSS-REFERENCE TO RELATED APPLICATION

This application claims priority to and the benefit of Korean Patent Application No. 10-2011-0079529 filed in the Korean Intellectual Property Office on Aug. 10, 2011, the entire contents of which are incorporated herein by reference.

BACKGROUND OF THE INVENTION (a) Field of the Invention

The present invention relates to an inverter system used in a hybrid vehicle or a fuel cell vehicle. More particularly, the present invention relates to an inverter for a vehicle that enhances assembling structures of a power module and a capacitor module.

(b) Description of the Related Art

Recently, people are interested in green energy, and a hybrid vehicle, an electric vehicle, and a fuel cell vehicle have received attention as future vehicles replacing a vehicle with an internal combustion engine. Such a hybrid vehicle and an electric/fuel cell vehicles use an engine and a high power motor as power sources.

The hybrid vehicle and the electric/fuel cell vehicles use an inverter system so as to charge a battery or a fuel cell by using electrical energy generated internally or to use DC electricity of high voltage generated at the battery or the fuel cell. The inverter system converts high voltage DC electricity generated at the battery or the fuel cell into three phase AC electricity including U, V, and W phases.

The inverter system includes a power module containing a power semiconductor device such as an insulated gate bipolar transistor (IGBT) and a capacitor module absorbing a ripple current generated by switching operation of the power semiconductor device of the power module.

Such a capacitor module is electrically connected to a high voltage DC input terminal being an input terminal of the inverter and the power module through a bus bar.

According to conventional arts, the power module and the capacitor module are mounted in a case independently. Since the capacitor module is relatively heavy, it is difficult for the power module, which is generally made of plastic material, to secure structural rigidity for supporting the capacitor module.

Since the power module and the capacitor module are mounted in the case independently, the case is provided with additional assembling holes for mounting the bus bar that electrically connects the power module with the capacitor module. That is, the bus bar electrically connecting the power module with the capacitor module is mounted through the assembling holes of the case.

Since the assembling holes for mounting the bus bar at the case is necessary, a cover, a bolt, and a sealant for closing the assembling holes are also necessary according to conventional arts. Therefore, assembling processes and components may increase, and thus manufacturing cost and weight may increase.

In addition, since the power module and the capacitor module are mounted at the case separately, assembling efficiency may be deteriorated according to conventional arts.

Since the cover for closing the assembling holes of the case and the sealant for sealing the cover are necessary, risk of leaking may increase and quality of the products may be deteriorated according to the conventional arts.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an inverter for a vehicle having advantages of enhancing structural rigidity, integrating a power module and a capacitor module, and removing assembling holes of a case for electrically connecting the power module with the capacitor module and a cover for closing the assembling holes.

An inverter for a vehicle according to one or more exemplary embodiments of the present invention includes: a power module provided with a power semiconductor device; a cooling module coupled to the power module and flowing a coolant therethrough; and a capacitor module mounted at the cooling module through a mounting unit and adapted to absorb a ripple current of the power module.

In one or more exemplary embodiments, the power module, the cooling module, and the capacitor module are pre-coupled so as to form a module assembly, and the module assembly is mounted in a case.

In one or more exemplary embodiments, the power module and the cooling module are coupled through a bolt.

In one or more exemplary embodiments, the mounting unit includes: at least one mounting boss integrally formed at an edge portion of the cooling module; at least one leg integrally formed at the capacitor module corresponding to the mounting boss; and a fastening member engaging the mounting boss with the leg.

In one or more exemplary embodiments, the cooling module further comprises an inlet for flowing the coolant in and an outlet for flowing the coolant out, and the case is provided with a pair of recesses in which the inlet and the outlet are fitted.

In one or more exemplary embodiments, the case has upper and lower ends that are open.

In one or more exemplary embodiments, the module assembly is coupled to a lower interior surface of the case through the lower open end of the case.

In one or more exemplary embodiments, the cooling module includes at least one of first coupling protrusions integrally formed at an edge portion and is coupled to the case, and the case includes a second coupling protrusion integrally formed at the lower interior surface and coupled to the first coupling protrusion by a bolt.

In one or more exemplary embodiments, the capacitor module is electrically connected to the power module through a bus bar in a state of being coupled with the cooling module.

An inverter for a vehicle according to one or more exemplary embodiments of the present invention includes: a module assembly formed by coupling a capacitor module to a cooling module after a power module and the cooling module is coupled; and a case is adapted to accommodate the module assembly and is coupled to the cooling module.

In one or more exemplary embodiments, the module assembly is mounted in the case in a state that the power module, the cooling module, and the capacitor module are coupled with each other.

BRIEF DESCRIPTION OF THE DRAWINGS

The drawings illustrate exemplary embodiments of the present invention and are not construed to limit any aspect of the invention.

DESCRIPTION OF SYMBOLS

10: module assembly;
20: case;
21: recess;
25: second coupling protrusion;
30: power module;
50: cooling module;
51: cooling plate;
53: bolt;
55: inlet;
57: outlet;
59: first coupling protrusion;
59a: bolt hole;
70: capacitor module;
71: housing;
75: fixing block;
80: bus bar;
90: mounting unit;
91: mounting boss;
92: engaging home;
93: leg;
94: engaging hole; and
95: fastening member.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Description of components that are not necessary for explaining the present invention will be omitted, and the same constituent elements are denoted by the same reference numerals in this specification.

In addition, size and thickness of components shown in the drawings may be differ from real size and real thickness of the components for better comprehension and ease of description. Therefore, the present invention is not limited to those shown in the drawings.

Further, it is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Figure 1:
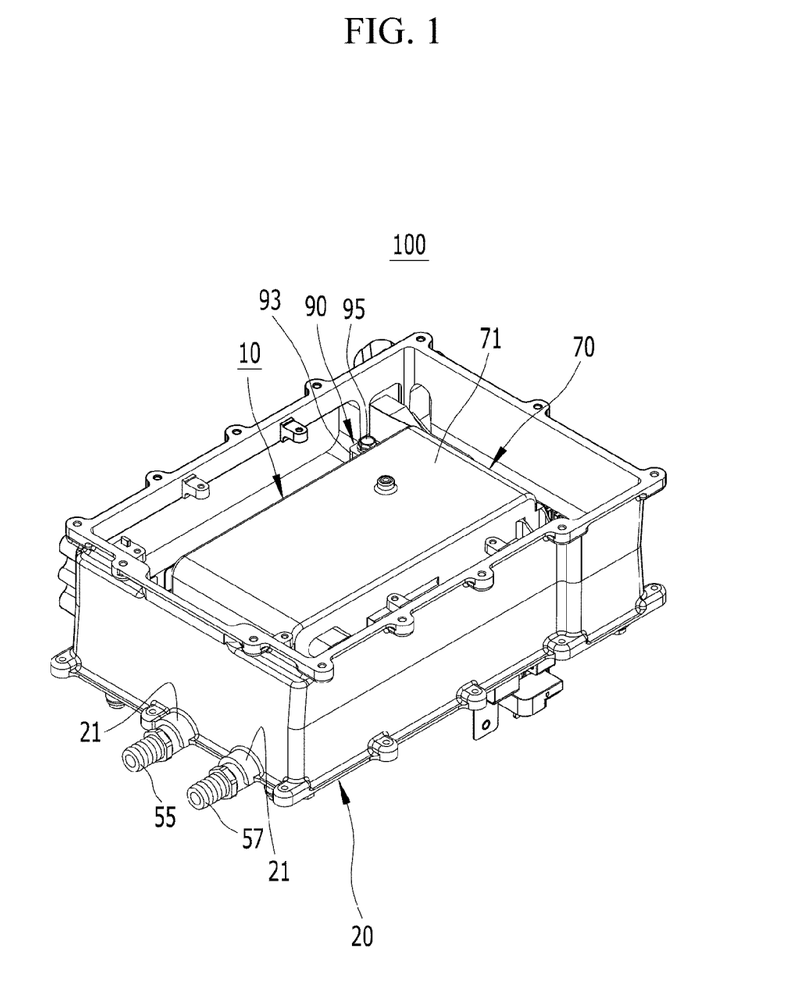
FIG. 1 is a perspective view of an inverter for a vehicle according to an exemplary embodiment of the present invention.
Figure 2:
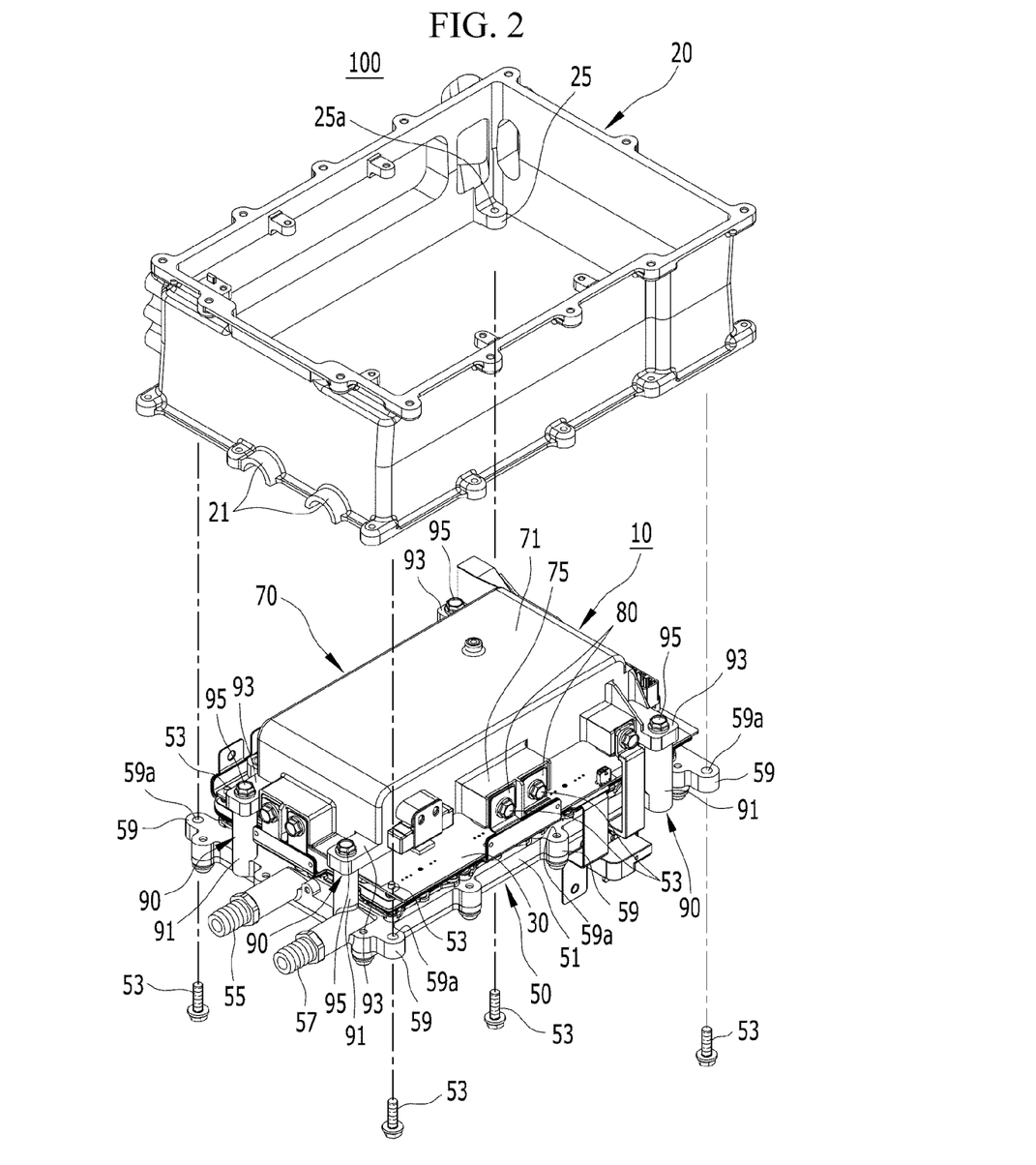
FIG. 2 is a partial exploded perspective view of an inverter for a vehicle according to an exemplary embodiment of the present invention.
Figure 3:
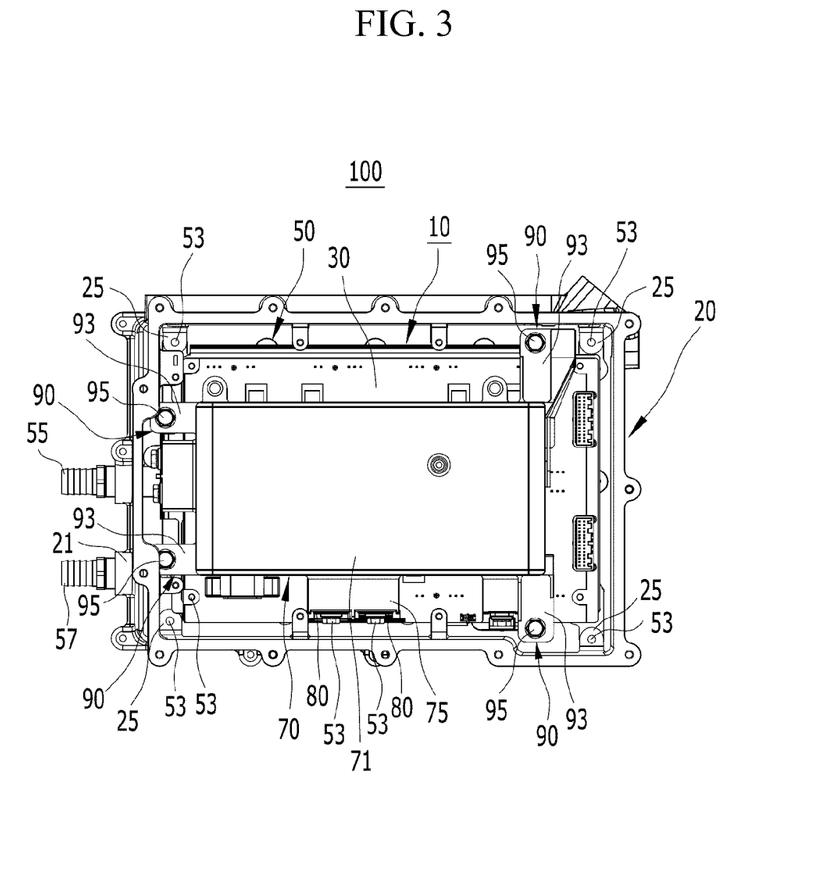
FIG. 3 is a top plan view of an inverter for a vehicle according to an exemplary embodiment of the present invention.
Figure 4:
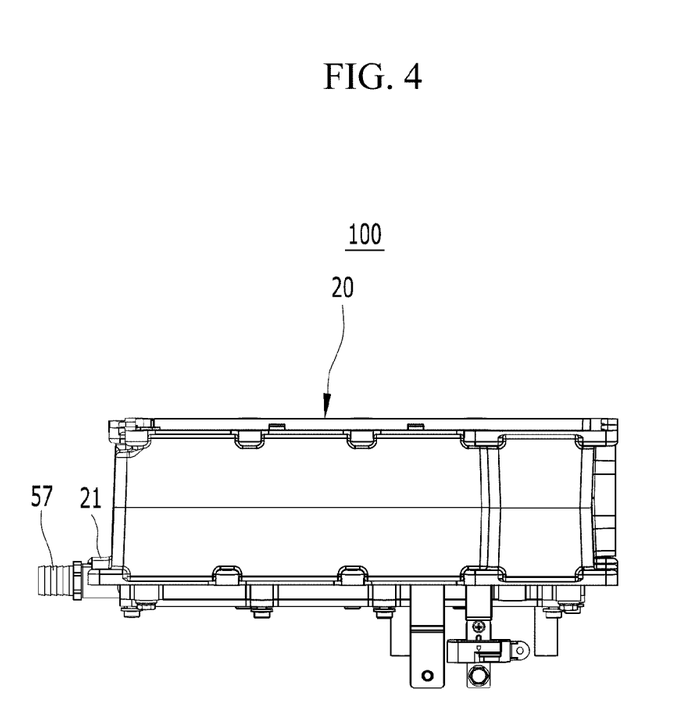
FIG. 4 is a side view of an inverter for a vehicle according to an exemplary embodiment of the present invention.
Figure 5:
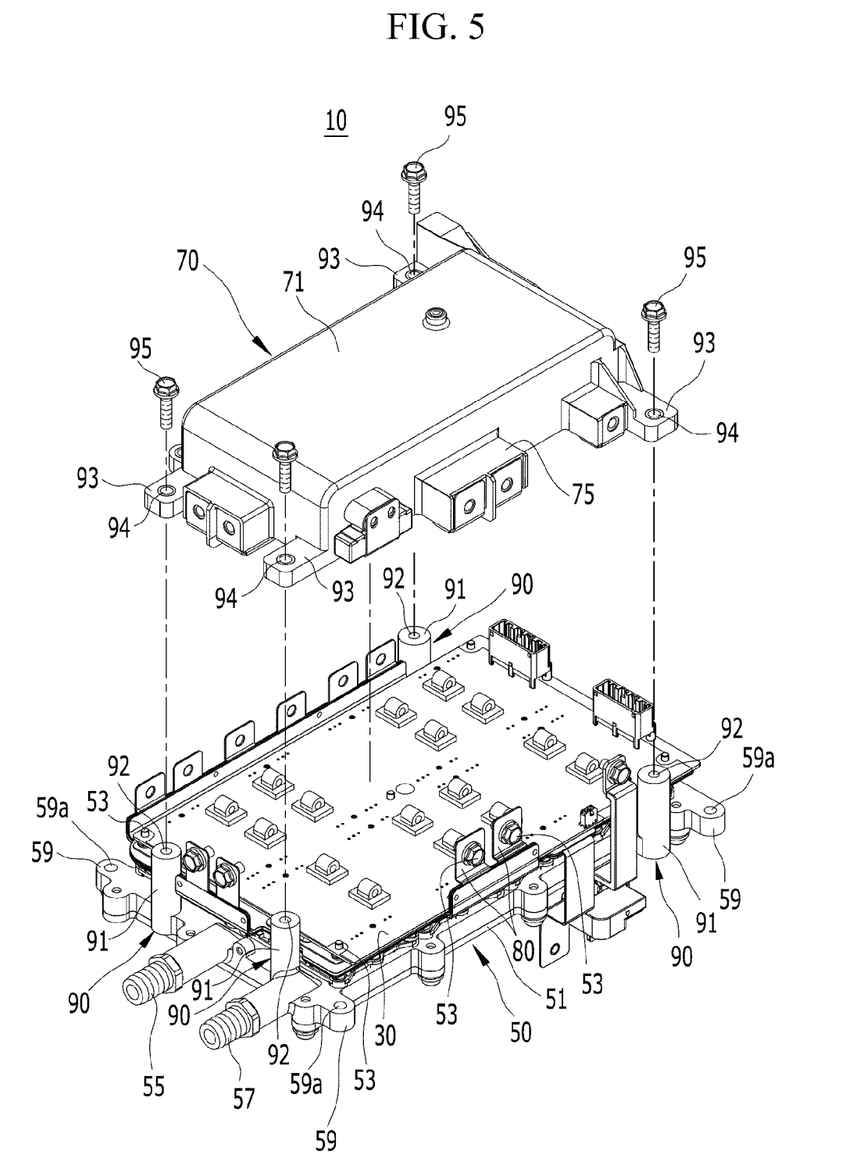
FIG. 5 is an exploded perspective view of a module assembly applied to an inverter for a vehicle according to an exemplary embodiment of the present invention.
Figure 6:
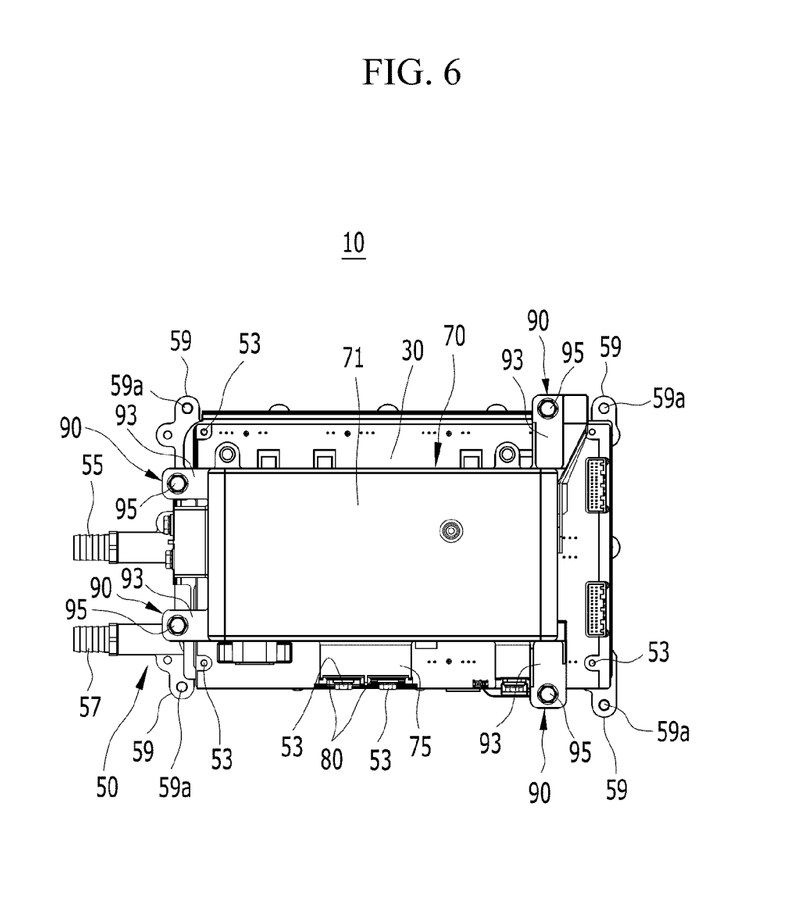
FIG. 6 is a top plan view of a module assembly applied to an inverter for a vehicle according to an exemplary embodiment of the present invention.
Figure 7:
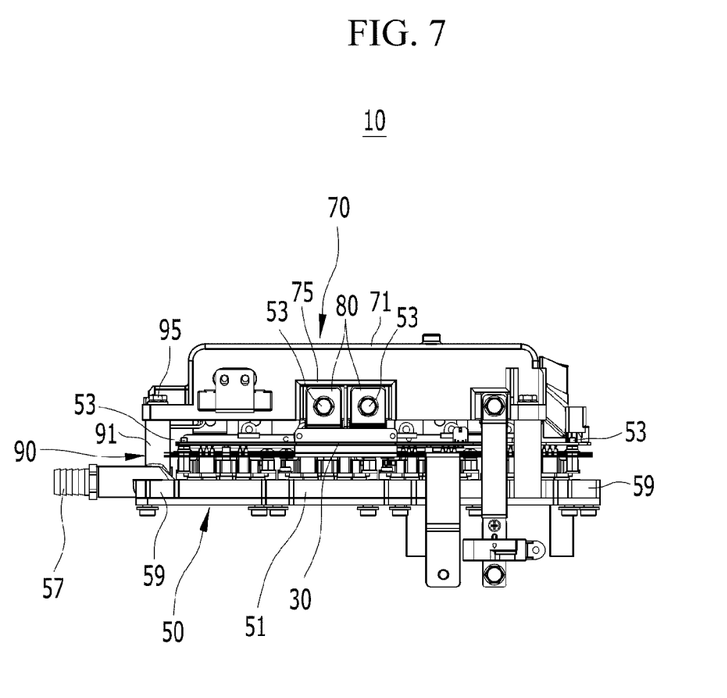
FIG. 7 is a side view of a module assembly applied to an inverter for a vehicle according to an exemplary embodiment of the present invention.

FIG. 1 is a perspective view of an inverter for a vehicle according to an exemplary embodiment of the present invention; FIG. 2 is a partial exploded perspective view of an inverter for a vehicle according to an exemplary embodiment of the present invention; FIG. 3 is a top plan view of an inverter for a vehicle according to an exemplary embodiment of the present invention; and FIG. 4 is a side view of an inverter for a vehicle according to an exemplary embodiment of the present invention.

Referring to FIG. 1 to FIG. 4, an inverter 100 for a vehicle according to an exemplary embodiment of the present invention can be applied to a hybrid vehicle or an electric/fuel cell vehicle that use an engine and a high power motor as power sources.

It is exemplified in this specification that the inverter 100 is used in conventional hybrid and electric vehicles that drive high power motor by receiving electricity of a battery.

The inverter 100 is a power conversion system that converts high voltage DC electricity generated at a battery into three phases AC electricity including U, V, and W phases so as to control the high power motor.

The inverter 100 for a vehicle according to an exemplary embodiment of the present invention is adapted to reduce the number of components, assembling processes, cost, and weight, to lower risk of leaking by minimizing sealing portions, and to improve assembling efficiency and quality.

For these purposes, the inverter 100 for a vehicle according to an exemplary embodiment of the present invention includes a module assembly 10 formed by integrally combining modules and a case 20 accommodating the module assembly 10.

In an exemplary embodiment of the present invention, the module assembly 10 is a major component of the inverter 100, and includes a power module 30, a cooling module 50, and a capacitor module 70.

Coupling structures of the power module 30, the cooling module 50, and the capacitor module 70 to the module assembly 10 will be described in further detail with reference to FIG. 1 to FIG. 7.

The power module 30 is a power semiconductor device (e.g., IGBT), is made of plastic material, and is electrically connected to the capacitor module 70.

The cooling module 50 is adapted to cool down the power module 30 and the capacitor module 70 by using refrigerant such as coolant, and is integrally combined with the power module 30.

Since the capacitor module 70 is mounted together with the power module 30, the cooling module 50 may be made of aluminum or other material that easily radiates heat, and cools down the power module 30 and the capacitor module 70 by circulating the refrigerant.

The cooling module 50 includes a cooling plate 51 having generally a rectangular shape. Hydraulic lines (not shown) for flowing the refrigerant are formed in the cooling plate 51.

Herein, the cooling plate 51 is coupled to the power module 30 by a bolt 53.

The cooling plate 51 is provided with an inlet 55 and an outlet 57. The inlet 55 is connected to the hydraulic lines and flows the refrigerant into the hydraulic lines, and the outlet 57 exhausts the refrigerant from the hydraulic lines. The inlet 55 and the outlet 57 are protruded from an edge portion of the cooling plate 51.

In addition, a plurality of first coupling protrusions 59 is formed with a distance at another edge portion of the cooling plate 51. The first coupling protrusion is coupled to an interior surface of the case 20.

A first bolt hole 59a for being coupled with a bolt 53 is formed at the first coupling protrusions 59. The cooling plate 51 is coupled to the interior surface of the case 20 by inserting the bolt 53 in the first bolt hole 59a of the first coupling protrusions 59.

The capacitor module 70 is adapted to absorb a ripple current generated by the power semiconductor device of the power module 30. That is, the capacitor module 70 absorbs the ripple current and suppresses abrupt change in DC input voltage, and thereby smoothes current/voltage.

The capacitor module 70 includes a plurality of unit modules (not shown) mounted in the housing 71 of aluminum material. The capacitor module 70 is adapted to operate the inverter normally and to increase durability of a high voltage battery.

The housing 71 of the capacitor module 70 is coupled to the cooling plate 51 of the cooling module 50 through a mounting unit 90.

Since the housing 71 of the capacitor module 70 is coupled to the cooling module 50 through the mounting unit 90, the capacitor module 70 is apart from an upper surface of the power module 30 by the mounting unit 90 and is coupled to the cooling module 50.

That is, the cooling plate 51 of the cooling module 50 is coupled to the capacitor module 70 through the mounting unit 90, and thereby supports the capacitor module 70 having comparatively heavy weight.

In an exemplary embodiment of the present invention, the mounting unit 90 includes a plurality of mounting bosses 91 protruded from an edge portion of the cooling plate 51 by a predetermined length, and a plurality of legs 93 integrally protruded from the housing 71 of the capacitor module 70 corresponding to the mounting boss 91.

The mounting boss 91 is adapted to support the capacitor module 70 having heavy weight substantially. Therefore, the mounting boss 91 has structural rigidity for supporting the capacitor module 70 and is formed vertically at the edge portion of the cooling plate 51. An engaging home 92 is formed at the mounting boss 91 in a vertical direction.

In addition, the leg 93 is protruded outwardly from a lower edge of the housing 71, and an engaging hole 94 is formed at the leg 93 corresponding to the engaging home 92 of the mounting boss 91.

Herein, the mounting unit 90 further includes a fastening member 95 for engaging the mounting boss 91 of the cooling plate 51 with the leg 93 of the capacitor module 70. A bolt can be used as the fastening member 95. The bolt penetrates the engaging hole 94 of the leg 93 and is threaded to the engaging home 92 of the mounting boss 91.

Meanwhile, the power module 30 and the capacitor module 70 are electrically connected to each other through a bus bar 80.

Such a bus bar 80 supplies a ripple current generated by switching operation of the power module 30 to the capacitor module 70, and electrically connects the power module 30 with the capacitor module 70 through (+) and (−) bus plates.

The bus bar 80 is electrically connected to the power module 30 and is also electrically connected to the capacitor module 70 through the bolt 53.

For this purpose, a fixing block 75 for fixing the (+) and (−) bus plates of the bus bar 80 by the bolt 53 is protruded from the housing 71 of the capacitor module 70.

The case 20 according to an exemplary embodiment of the present invention, as shown in FIG. 1 to FIG. 4, is adapted to receive and accommodate the module assembly 10 to which the power module 30, the cooling module 50, and the capacitor module 70 are integrally combined.

The case 20 has rectangular shape having a receiving space for accommodating the module assembly 10, and is coupled to the cooling module 50 of the module assembly 10.

The case 20 has upper and lower ends being open, and the module assembly 10 can be coupled to a lower interior surface of the case 20 through the lower open end of the case 20.

That is, the cooling plate 51 of the cooling module 50 can be coupled to the lower interior surface of the case 20.

A second coupling protrusion 25 which can be coupled to the first coupling protrusion 59 of the cooling plate 51 by the bolt 53 is formed at each edge portion of the lower interior surface of the case 20. A second bolt hole 25a is formed at the second coupling protrusion 25, and the bolt 53 is threaded to the second bolt hole 25a.

Therefore, in a state that the first bolt hole 59a of the first coupling protrusion 59 and the second bolt hole 25a of the second coupling protrusion 25 are aligned, the bolt 53 is inserted in and is threaded to the first and the second bolt holes 59a and 25a. Therefore, the cooling plate 51 of the cooling module 50 is coupled with the lower interior surface of the case 20.

In addition, a pair of recesses 21 is formed at the case 20. The inlet 55 and the outlet 57 of the cooling plate 51 are fitted in the pair of recesses 21.

Assembling processes of the inverter 100 according to an exemplary embodiment of the present invention will be described in detail with reference to the drawings.

According to an exemplary embodiment of the present invention, the power module 30 is coupled to the cooling plate 51 by the bolt 53. The power module 30 may be made of plastic material and is coupled to the upper surface of the cooling plate 51.

After that, the housing 71 of the capacitor module 70 is mounted at the cooling plate 51 of the cooling module 50. At this time, after the leg 93 of the housing 71 is laid on the mounting boss 91 of the cooling plate 51, the engaging hole 94 of the leg 93 is aligned with the engaging home 92 of the mounting boss 91.

If the fastening member 95 such as the bolt is coupled to the engaging hole 94 of the leg 93 at such a state, the fastening member 95 is coupled to the engaging home 92 of the mounting boss 91 and the housing 71 of the capacitor module 70 is mounted at the cooling plate 51.

In this case, the housing 71 of the capacitor module 70 is disposed apart from the power module 30 by the mounting boss 91 and can be coupled to the cooling plate 51.

Since the capacitor module 70 is coupled to the cooling plate 51 through the mounting boss 91, the module assembly 10 can secure structural rigidity for supporting the capacitor module 70 having heavy weight.

After that, the bus bar 80 connected to the power module 30 is fixed to the fixing block 75 of the capacitor module 70 by the bolt 53. Thereby, the power module 30 and the capacitor module 70 are electrically connected to each other through the bus bar 80.

The power module 30, the cooling module 50, and the capacitor module 70 are integrally combined so as to form the module assembly 10 by mounting the cooling module 50 to which the power module 30 is coupled to the capacitor module 70.

After that, the module assembly 10 is disposed in the case 20 through the lower open end of the case 20, and the inlet 55 and the outlet 57 of the cooling module 50 are coupled to the recess 21 of the case 20.

At a state that the first bolt hole 59a of the first coupling protrusion 59 of the cooling plate 51 is aligned with the second bolt hole 25a of the second coupling protrusion 25 of the case 20, the cooling plate 50 is assembled to the lower interior surface of the case 20 by engaging the bolt 53 to the first and second bolt holes 59a and 25a.

If the module assembly 10 is assembled to the case 20, an upper cover (not shown) is coupled to an upper end portion of the case 20 and a lower cover (not shown) is coupled to a lower end portion of the case 20. Therefore, the inverter 100 according to an exemplary embodiment of the present invention is assembled completely.

As described above, the inverter 100 for the vehicle according to an exemplary embodiment of the present invention is assembled by coupling the power module 30 to the cooling module 50, coupling the capacitor module 70 to the cooling module 50 through the mounting unit 90, and mounting the module assembly 10 formed by integrally assembling the power module 30, the cooling module 50, and the capacitor module 70 in the case 20.

The exemplary embodiment of the present invention, different from the conventional arts where assembling holes for mounting the bus bar electrically connecting the power module with the capacitor module is formed at the case, does not need the assembling holes for mounting the bus bar 80 to the case 20 and the cover, the bolt, and the sealant for closing the assembling holes.

Therefore, assembling processes, components, manufacturing cost, and weight may be reduced.

Since the power module 30 and the capacitor module 70 are assembled to the cooling module 50 separately and the module assembly 10 is mounted in the case 20, assembling efficiency may be improved according to an exemplary embodiment of the present invention.

Since the cover for closing the assembling holes of the case and the sealant for sealing the cover are not necessary, risk of leaking may be reduced and quality may be improved according to an exemplary embodiment of the present invention.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An inverter for a vehicle, comprising:
    a power module provided with a power semiconductor device;
    a cooling module coupled to the power module and configured to flow a coolant therethrough; and
    a capacitor module mounted at the cooling module through a mounting unit and configured to absorb a ripple current of the power module,
    wherein the cooling module further comprises an inlet configured to flow the coolant in and an outlet configured to flow the coolant out, and
    wherein the case is provided with a pair of recesses in which the inlet and the outlet are fitted.

2. The inverter of claim 1, wherein the case has upper and lower ends being open.

3. The inverter of claim 2, wherein the module assembly is coupled to a lower interior surface of the case through the lower open end of the case.

4. The inverter of claim 3, wherein the cooling module includes at least one of first coupling protrusions integrally formed at an edge portion and is coupled to the case, and
    wherein the case includes a second coupling protrusion integrally formed at the lower interior surface and coupled to the first coupling protrusion by a bolt.

5. The inverter of claim 1, wherein the power module and the cooling module are coupled through a bolt.

6. The inverter of claim 1, wherein the mounting unit comprises:
    at least one mounting boss integrally formed at an edge portion of the cooling module;
    at least one leg integrally formed at the capacitor module corresponding to the mounting boss; and
    a fastening member engaging each mounting boss with a respective leg.

7. The inverter of claim 1, wherein the capacitor module is electrically connected to the power module through a bus bar when coupled with the cooling module.

* * * * *